United States Patent [19]
Kikkawa

[11] Patent Number: 5,955,742
[45] Date of Patent: Sep. 21, 1999

[54] SEMICONDUCTOR DEVICE FORMED ON A SUBSTRATE HAVING AN OFF-ANGLE SURFACE AND A FABRICATION PROCESS THEREOF

[75] Inventor: Toshihide Kikkawa, Kawasaki, Japan

[73] Assignee: Fujitsu Limited, Kanagawa, Japan

[21] Appl. No.: 09/012,446

[22] Filed: Jan. 23, 1998

Related U.S. Application Data

[62] Division of application No. 08/625,704, Apr. 3, 1996, Pat. No. 5,751,028.

[30] Foreign Application Priority Data

Apr. 28, 1995 [JP] Japan ..................................... 7-104916

[51] Int. Cl.⁶ .............................. H01L 29/06; H01L 29/04
[52] U.S. Cl. ................................ 257/14; 257/15; 257/17; 257/628
[58] Field of Search ................................ 257/14, 15, 17, 257/18, 22, 627, 628, 190, 192, 194, 200, 280

[56] References Cited

U.S. PATENT DOCUMENTS

| | | | |
|---|---|---|---|
| 5,436,468 | 7/1995 | Nakata et al. | 257/28 |
| 5,521,404 | 5/1996 | Kikkawa et al. | 257/194 |
| 5,751,028 | 5/1998 | Kikkawa | 257/192 |
| 5,762,706 | 6/1998 | Saito et al. | 438/265 |

FOREIGN PATENT DOCUMENTS 8-3069703  11/1996  Japan ..................................... 21/331

*Primary Examiner*—Tom Thomas
*Assistant Examiner*—Ori Nadav
*Attorney, Agent, or Firm*—Armstrong, Westerman, Hattori, McLeland & Naughton

[57] ABSTRACT

A compound semiconductor device includes a compound semiconductor layer having an upper major surface formed with a multi-step structure, wherein said multi-step structure includes a plurality of steps each having a step height of at least 5 atomic layers and a step width of 300 nm or more.

7 Claims, 9 Drawing Sheets

SEMICONDUCTOR DEVICE FORMED ON A SUBSTRATE HAVING AN OFF-ANGLE SURFACE AND A FABRICATION PROCESS THEREOF

This is a divisional of application Ser. No. 08/625,704 filed Apr. 3, 1996, now U.S. Pat. No. 5,751,028.

BACKGROUND OF THE INVENTION

The present invention generally relates to semiconductor devices and more particularly to a compound semiconductor device formed on a substrate having an off-angle surface.

Compound semiconductor devices are used extensively for high speed applications due to the small effective mass of electrons in the compound semiconductor materials forming such semiconductor devices.

A compound semiconductor devices is formed on a substrate of a compound semiconductor material such as GaAs or InP, wherein such a compound semiconductor substrate is generally formed to have an off-angle major surface that is inclined with respect to the (100) surface by an angle of typically 1–2°. As a result of the offset, such an inclined surface includes a number of steps each having a (100) surface and a corresponding step edge.

By forming steps with a regular pitch on the surface of the substrate, control of uniform growth of the semiconductor layers on the substrate is substantially facilitated. It should be noted that the growth of semiconductor layers occurs laterally from each step edge along the (100) surface.

On the other hand, such a lateral growth of the semiconductor layers generally includes a fluctuation in the rate of growth, and as a result, there usually occurs a formation of multi-step structure indicated in FIG. 1 at the location where the lateral growth of the crystal surface is impeded.

Referring to FIG. 1, it will be noted that a semiconductor layer 2 grown on an inclined upper major surface of a substrate 1 includes a number of steps 2a–2c each having a step height H and a step width W, wherein the step height H is at least 10Å and includes several or more atomic layers. The inclined surface of the substrate 1, represented in FIG. 1 by a continuous straight line, is actually formed of a number of more smaller steps each having a step height of one or two atomic layers and a much more smaller step width. Thus, it should be noted that the inclined straight line of FIG. 1 does not mean that the surface is formed by a flat crystal surface.

In the stepped structure of FIG. 1, it should be noted that the steps are formed with a generally regular, periodical pitch, with the step width W of typically less than 200 nm. While the multi-step structure is formed as a result of random fluctuation in the growth rate of the semiconductor layers, it is believed that such a regular, periodical step structure develops ultimately as a stable structure.

Referring to FIG. 2 showing a model band structure of the semiconductor layer 2, it will be noted that the appearance the periodical structure as indicated in FIG. 1 causes scattering of carriers having a Fermi energy $E_F$ and corresponding wave number $k_F$, between the state where the wave number is $+k_F$ and the state where the wave number is $-k_F$ when the pitch and hence the step width W is small enough in correspondence to the wavelength of the electron waves in such a structure. In FIG. 2, Eg represents the bandgap. When such a scattering of carriers occurs in a FET such as HEMT or MESFET, the device performance is deteriorated substantially. This problem of scattering of the carriers by the stepped structure of the semiconductor layers becomes conspicuous particularly in the so-called E-mode FETs where $E_F$ is mall and the electron waves have a wavelength that causes a resonance with the periodical step structure.

Further, it should be noted that such a structure having a multi-step structure is unstable against the process steps applied thereto. For example, an etching step applied to a part of the step may result in a removal of the entire step. Further, existence of such a large step causes a physical scattering of the carriers, which is detrimental to the operation of a FET such as a HEMT.

In order to eliminate such a scattering of the carriers, it is desired to increase the step width W and hence the pitch of the steps as much as possible.

Meanwhile, conventional compound semiconductor devices, whether it may be a FET such as a HEMT or a bipolar device such as a HBT, have suffered from the problem of increased resistance between an active layer such as an electron supplying layer or an emitter layer and a cap layer provided thereon.

FIG. 3 shows a carrier density profile for a heteroepitaxial structure in which an InGaP layer is grown on a GaAs layer. It will be noted that there occurs a remarkable depletion of carriers at the heterojunction interface between GaAs and InGaP designated by an arrow.

Such an increase of the resistance is caused by the depletion of the carriers taking place at such a heterojunction interface, wherein such a depletion of the carriers is caused by the distortion of crystal lattice at such a heterojunction interface. It should be noted that the active layer is typically formed of InGaP while the cap layer is usually formed of GaAs.

SUMMARY OF THE INVENTION

Accordingly, it is a general object of the present invention to provide a novel and useful compound semiconductor device and a fabrication process thereof wherein the foregoing problems are eliminated.

Another and more specific object of the present invention is to provide a compound semiconductor device having a semiconductor layer defined by an inclined, stepped upper major surface and a fabrication process thereof, wherein scattering of carriers caused by a generally periodical multi-step structure formed on the stepped upper major surface of the semiconductor layer, is successfully eliminated.

Another object of the present invention is to provide a high electron mobility transistor, comprising:

a substrate of semi-insulating GaAs having an inclined upper major surface;

a channel layer of undoped InGaAs provided on said substrate;

an electron supplying layer of n-type InGaP provided on said channel layer;

a cap layer of n-type GaAs provided on said electron supplying layer;

a gate electrode provided on said electron supplying layer with a Schottky contact therewith;

a source electrode provided on said cap layer at a first side of said gate electrode with an ohmic contact to said cap layer; and a drain electrode provided on said cap layer at a second, opposite side of said gate electrode with an ohmic contact to said cap layer;

said channel layer having a multi-step structure on an upper major surface thereof, wherein said multi-step structure includes a number of steps each having a step height of five or more atomic layers and a step width of 300 nm or more.

Another object of the present invention is to provide a heterobipolar transistor, comprising:

a substrate of semi-insulating GaAs having an inclined upper major surface;

a collector layer of GaAs having a first conductivity type, provided on said substrate;

a base layer of GaAs having a second, opposite conductivity type, provided on said collector layer;

an emitter layer of said first conductivity type, provided on said base layer;

a cap layer of InGaAs having said first conductivity type, provided on said emitter layer;

collector electrode provided on said collector layer;

a base electrode provided on said base layer; and an emitter electrode provided on said cap layer;

said emitter layer having a multi-step structure on an upper major surface thereof, wherein said multi-step structure includes a number of steps each having a step height of five or more atomic layers and a step width of 300 nm or more.

Another object of the present invention is to provide a quantum well structure, comprising:

a substrate of GaAs;

a first barrier layer of InGaP provided on said substrate;

a quantum well layer of GaAs provided on said first barrier layer with a thickness of about ten molecular layers; and a second barrier layer of InGaP provided on said quantum well layer, wherein said quantum well structure provides photon emission at 77 K with a wavelength shorter than about 750 nm.

Another object of the present invention is to provide a compound semiconductor device, comprising:

a substrate of a compound semiconductor material having an inclined upper major surface;

an active layer of a compound semiconductor material provided on said substrate, said active layer having a multi-step structure on an upper major surface thereof;

a cap layer of a compound semiconductor material provided on said active layer; and an electrode provided on said cap layer;

wherein said multi-step structure includes a plurality of steps each having a step height of at least several atomic layers and a step width of 300 nm or more.

Another object of the present invention is to provide a method for fabricating a compound semiconductor device, comprising the steps of:

providing a first buffer layer of undoped GaAs on a substrate of a semi-insulating GaAs by a MOVPE process with a thickness smaller than 500 nm, said substrate having an inclined upper major surface;

providing a layer of InGaP on said first buffer layer with a thickness of 100 nm or less by a MOVPE process;

providing a second buffer layer on said first buffer layer by a MOVPE process; and providing an active layer on said second buffer layer.

Another object of the present invention is to provide a method for fabricating a compound semiconductor device, comprising the steps of:

growing a buffer layer of undoped GaAs on a substrate of a semi-insulating GaAs by a MOVPE process with a growth rate exceeding 0.6 nm/sec; and providing an active layer on said buffer layer.

According to the present invention, it is possible to eliminate the scattering of carriers by the periodically repeated steps on the surface of the inclined semiconductor layer by increasing the pitch of the steps to 300 nm or more. Such a large step pitch is achieved by increasing the growth rate of the second group III–V compound semiconductor layer.

Another object of the present invention is to eliminate the depletion of carriers at a heterojunction interface formed in a compound semiconductor device between a first group III–V compound semiconductor layer having a first lattice constant and a second group III–V compound semiconductor layer having a second, different lattice constant.

Another object of the present invention is to provide a compound semiconductor device, comprising:

a substrate of a compound semiconductor material having an inclined upper major surface;

an active layer of a compound semiconductor material provided on said substrate, said active layer having a multi-step structure on an upper major surface thereof;

a cap layer of a compound semiconductor material provided on said active layer; and an electrode provided on said cap layer;

wherein said upper major surface of said substrate is inclined by an offset angle of 2° or more.

Another object of the present invention is to provide a method for fabricating a semiconductor device, comprising the steps of:

providing a first group III–V compound semiconductor layer containing P on a substrate having an inclined upper major surface; and growing a second group III–V compound semiconductor containing As on said first group III–V compound semiconductor layer by a MOVPE process, wherein said upper major surface of said substrate is inclined with respect to a (100-oriented surface by an offset angle of 2° or more.

According to the present invention, the depletion of carriers at the heteroepitaxial interface between the first and second group III–V compound semiconductor layers is successfully eliminated by setting the offset angle of the inclined upper major surface of the substrate to 2° or more.

Other objects and further features of the present invention will become apparent from the following detailed description when read in conjunction with the attached drawings.

DETAILED DESCRIPTION OF THE PREFERRED EMBODIMENTS

Figure 4:
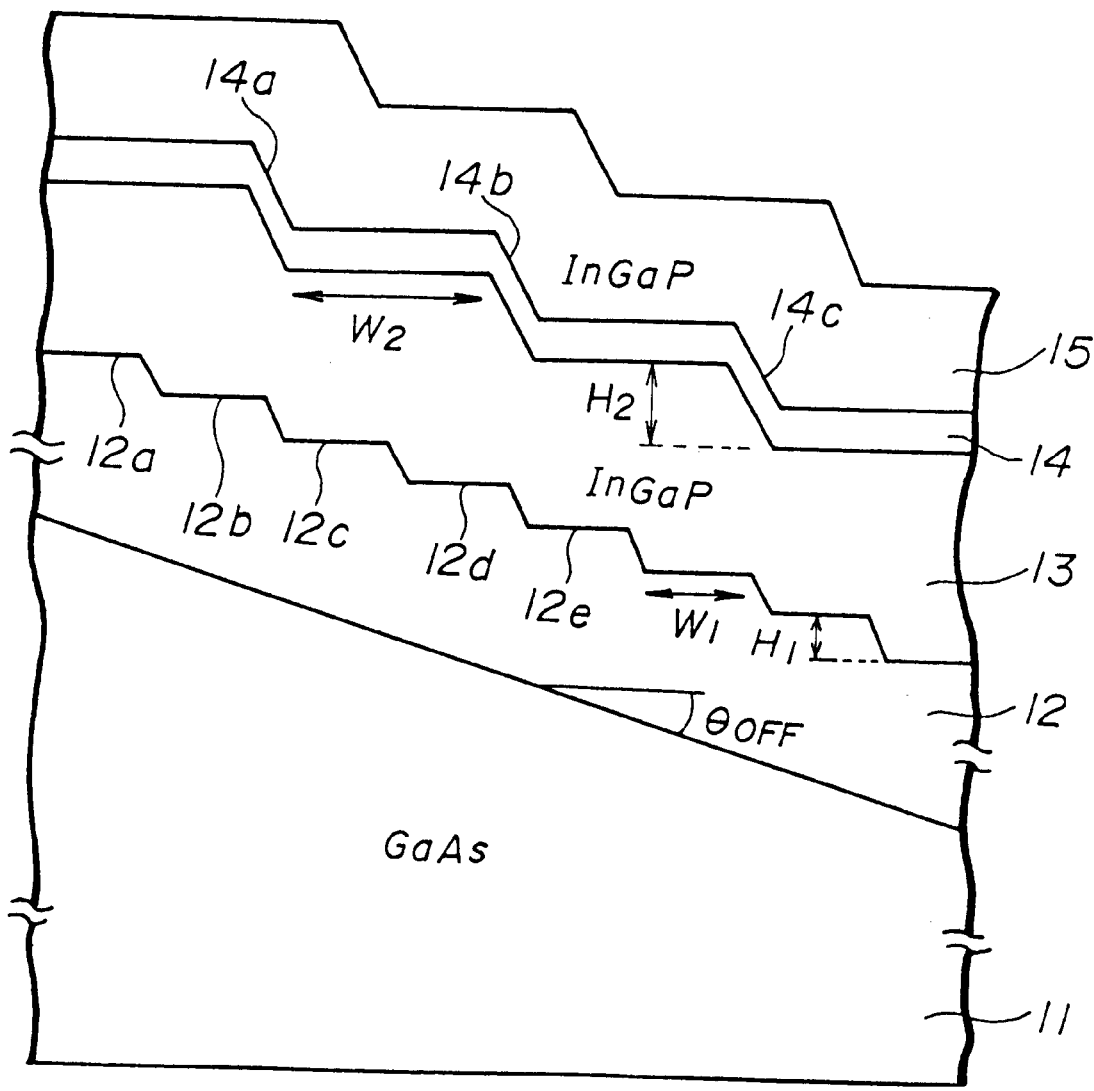
FIG. 4 is a diagram explaining the principle of the present invention.

FIG. 4 shows a model structure produced for evaluating the feasibility of the present invention.

Referring to FIG. 4, the model structure includes a GaAs substrate 11 having an inclined upper major surface that is inclined with respect to the (100) surface by an angle $\theta_{OFF}$ toward the (111)A surface, wherein a buffer layer 12 of GaAs is deposited on the foregoing inclined upper major surface epitaxially with a thickness of about 600 nm by an MOVPE process using TMGa (trimethylgallium) or TEGa (triethylgallium) and $AsH_3$ or tBAs (tertiary-butylarsine). During the growth of the GaAs layer 12, there develops a multi-step structure characterized by a number of steps 12a–12e each having a step width $W_1$ and a step height $H_1$ as usual, wherein it is known that the width $W_1$ increases generally with the thickness of the layer 12, while there appears a saturation in the increase of the step width $W_1$ at a certain limit of about 200 nm as indicated in FIG. 5.

Figure 5:
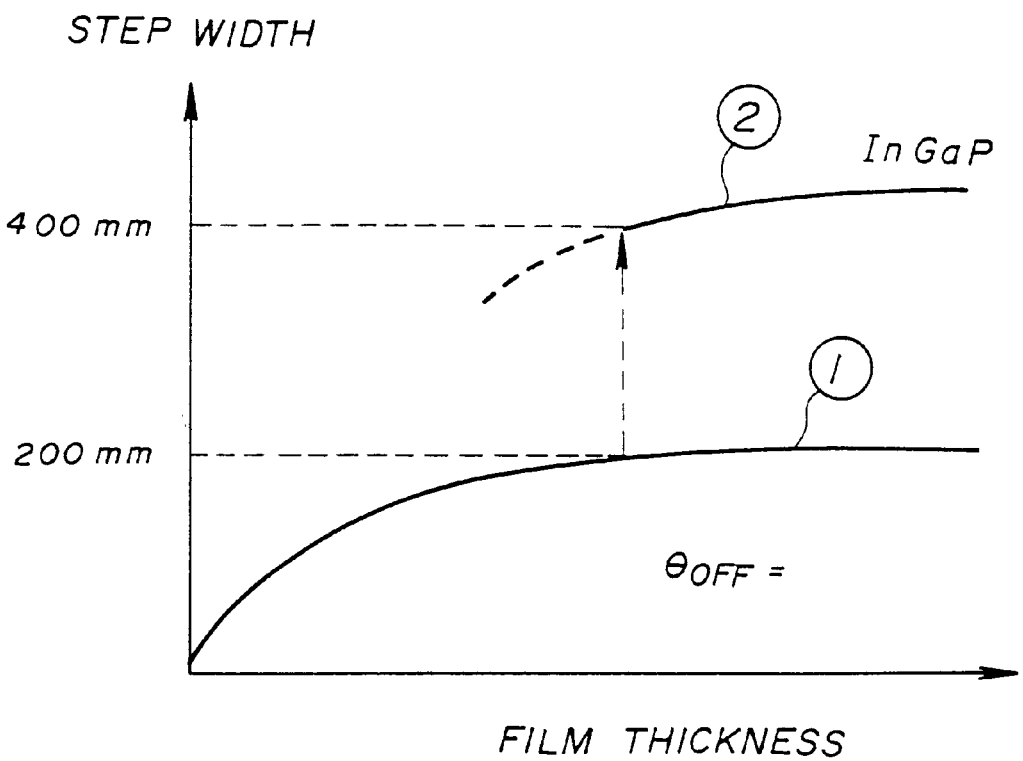
FIG. 5 is another diagram explaining the principle of the present invention.

It should be noted that FIG. 5 shows a curve 1 representing the relationship between the step width and the thickness of a GaAs layer grown on a substrate having an inclined upper major surface, wherein the relationship of FIG. 5 holds true also in the structure of FIG. 4, in which the buffer layer 12 of GaAs is grown epitaxially on the GaAs substrate 11. The relationship of FIG. 5 clearly indicates that conventional process cannot increase the step width $W_1$ beyond 200 nm.

In the structure of FIG. 4, a layer of InGaP 13 is deposited epitaxially on the buffer layer 12 with a thickness of less than 100 nm by an MOVPE process using TMIn (trimethylindium), TMGa or TEGa and $PH_3$, and there is formed a stepped structure also on the inclined upper major surface of the layer 13 characterized by a step height $H_2$ corresponding to several (at least five) atomic layers and a step width $W_2$, wherein it was discovered that the step width $W_2$ of the layer 13 can be increased beyond 400 nm as indicated by a curve 2 in FIG. 5, by providing the InGaP layer 13 with the aforementioned thickness of less than 100 nm within the distance of 500 nm from the upper major surface of the substrate.

Even when the layer 12 is formed of a group III–V compound semiconductor material other than InGaP such as GaAs, AlGaAs or InGaAs, it was found that one can increase the step width $W_2$ above 300 nm, by increasing the growth rate of the layer 12 above about 0.6 nm/sec. When the growth rate is smaller than the foregoing rate of 0.6 nm/sec as in the case of conventional growth rate of 0.1–0.3 nm/sec, the stepped structure of the layer 12 is merely transferred to the layer 13 thereon. Such a large growth rate can be achieved for example by increasing the supply rate of the gaseous source of the group III element with respect to the supply rate of the gaseous source of the group V element such that the ratio of the flowrate of the group V element to the flowrate of the group III element falls in a range between about 1 and about 5.

In the structure of FIG. 4, a layer 14 of GaAs is deposited further on the layer 13 with a thickness of 4 nm corresponding to 10 molecular layers. Thereby, the stepped structure of the layer 13 is transferred to the layer 14, and there appear corresponding steps 14a, 14b and 14c on the upper major surface of the layer 14. Further, another InGaP layer 15 is deposited on the layer 14. As a result, the GaAs layer 14 forms a quantum well structure.

In the model structure of FIG. 4, there is a substantial possibility that a mixing occurs between P in the layer 13 and As in the layer 14 when the GaAs layer 14 is deposited on the InGaP layer 13. It should be noted that P in the InGaP layer 13 easily escapes due to the high vapor pressure of P, leaving a vacant site in the layer 13. Thereby, the deposition of the GaAs layer 14 on the layer 13 by an MOVPE process inevitably causes a penetration of As from the layer 14 into the layer 13, resulting in the mixing of P and As at the heteroepitaxial interface between the layer 13 and the layer 14 thereon. When such a mixing of P and As having respective, different atomic radii, occurs at the heteroepitaxial interface, there occurs a substantial distortion of crystal lattice in the layer 13, while such a distortion of the crystal lattice, in which the periodical arrangement of atoms is disturbed, leads to a depletion of carriers at such a heteroepitaxial interface. When such a depletion of carriers occurs in the current path of a device such as HEMT or HBT, the resistance of the device is increased, while such an increase of the resistance causes a serious deterioration of the high frequency performance of the device. This problem will be reviewed further later in detail in relation to the HEMT structure.

In order to evaluate the sharpness of the heterojunction interface for the quantum well layer 14 of FIG. 4, the inventor of the present invention has conducted a series of experiments for measuring the photoluminescent spectrum of the quantum well formed in the model structure of FIG. 4.

The following TABLE I represents the result of the measurement of the photoluminescent spectrum. In the experiment, a number of samples were produced with respective off-angles $\theta_{OFF}$ of 2°, 6° and 16°, wherein the photoluminescent spectrum was measured at 77 K by applying a laser radiation having a wavelength of 514 nm to the structure of FIG. 4 from the upward direction thereof.

TABLE I

| off-angle | 2° | 6° | 16° |
| --- | --- | --- | --- |
| step width = 100 nm | 820 nm | 770 nm | 760 nm |
| step width = 300 nm | n.d. | 750 nm | 720 nm | n.d. unable to detect photoluminescence

The result of Table I indicates that, when the step width $W_2$ of FIG. 4 is set to 100 nm and the off-angle $\theta_{OFF}$ set to 2°, the photoluminescent spectrum peak appears at the wavelength of 820 nm, indicating that there occurs a substantial formation of InGaAsP having a small bandgap at the heteroepitaxial interface between the layer 13 and the layer 14 as a result of mixing of In, Ga and P that form the layer 13 and Ga and As that form the layer 14. Without formation of such an InGaAsP layer at the heteroepitaxial interface, the photoluminescent peak should appear at the wavelength of about 720 nm. In other words, the result of TABLE I indicates that one can avoid the undesirable formation an InGaAsP layer and hence the mixing of As and P at the heteroepitaxial interface, by setting the off-angle $\theta_{OFF}$ equal to or larger than 6°. It is believed that one can successfully eliminate the problem of mixing of As and P by increasing the off-angle $\theta_{OFF}$ to 2° or more, preferably 3° or more. The combination of the step width $W_2$ of 300 nm and the off-angle $\theta_{OFF}$ of less than 2° did not give a detectable photoluminescence.

Figure 6:
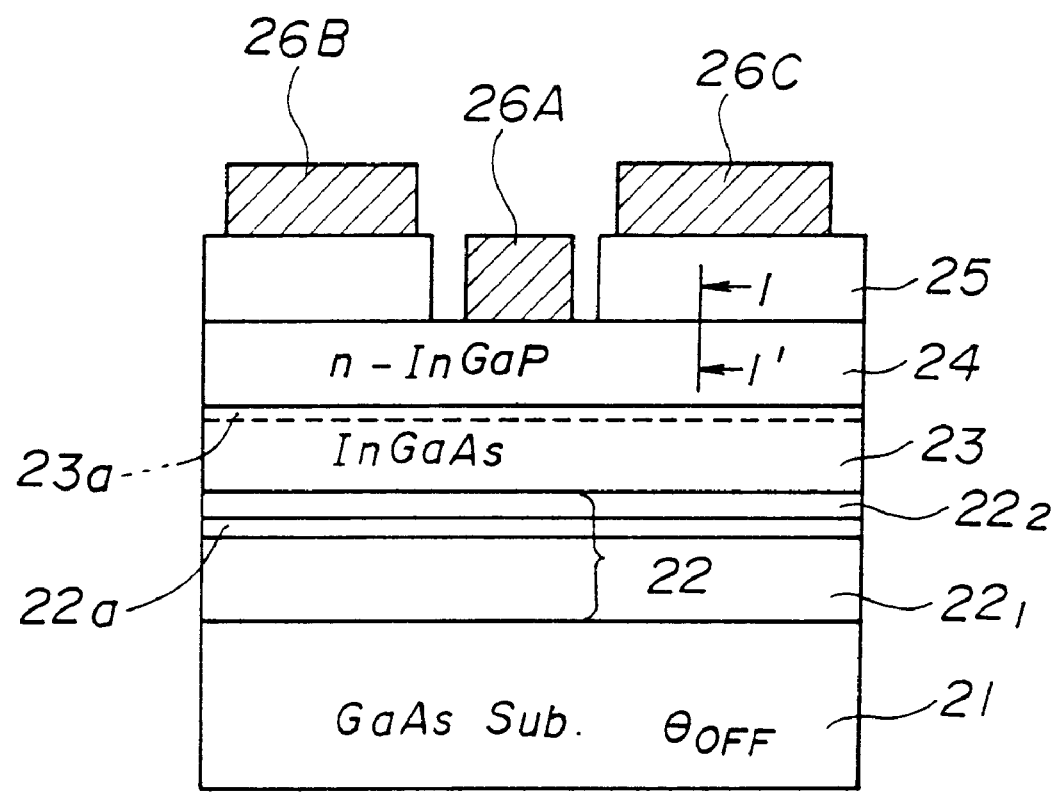
FIG. 6 is a diagram showing the construction of a HEMT according to a first embodiment of the present invention.

FIG. 6 shows the structure of a HEMT according to a first embodiment of the present invention.

Referring to FIG. 6, the HEMT is constructed on a semi-insulating GaAs substrate 21 having an inclined upper major surface, and a buffer layer 22 of undoped GaAs is grown by a MOVPE process with a thickness of about 500 nm, wherein a thin layer 22a of InGaP, typically having a thickness of 100 nm or less, is formed so as to divide the buffer layer 22 into a lower layer $22_1$ and an upper layer $22_2$. By forming the InGaP layer 22a, the upper buffer layer $22_2$ is characterized by a step height of at least several atomic layers and a step width equal to or larger than 300 nm.

Alternatively, one may form the entire buffer layer 22 with an increased growth rate of 0.6 nm/sec or more. Thereby, the step width of the multi-step structure on the upper major surface of the layer $22_2$ exceeds beyond 300 nm or more. In order to achieve the growth rate of 0.6 nm/sec or more for the layer $22_2$, the flowrate of TMG or TEG is increased as compared with the conventional MOVPE process such that the ratio of flowrate of arsine to the flowrate of TMG or TEG falls approximately in the range between 1 and 5, contrary to the conventional case in which the ratio is set in the range between 20 and 50. Alternatively, the foregoing ratio may be set higher than about 100 but lower than about 200 such that a very large amount of the group V gaseous source is supplied.

On the buffer layer 22 thus formed, a channel layer 23 of undoped InGaAs is grown epitaxially by an MOVPE process with a thickness of 14 nm, and an electron supplying layer 24 of n-type InGaP is grown epitaxially further on the channel layer by an MOVPE process with a thickness of 27 nm. Thereby, a two-dimensional electron gas 23a is formed in the channel layer 23 along a heterojunction interface between the layer 23 and the layer 24.

Further, a cap layer 25 of n-type GaAs is grown epitaxially on the electron supplying layer 24 by an MOVPE process with a thickness of 70 nm, and a Schottky electrode 26A is provided on the cap layer 25 in correspondence to a channel region of the HEMT as a gate electrode. Further, a pair of ohmic electrodes 26B and 26C are provided on the cap layer 25 at both sides of the gate electrode 26A respectively as a source electrode and a drain electrode.

In the structure of FIG. 6, the composition of the InGaP layer 24 is adjusted such that the lattice misfit at the heterojunction interface between the layer 24 and the layer 25 thereon or between the layer 24 and the layer 23 does not exceed 1×10⁻³, for minimizing the occurrence of dislocations at such heteroepitaxial interfaces. Further, the electron supplying layer 24 is formed by conducting the deposition process thereof under a growth temperature of less than 600° C., so that the InGaP layer 24 does not contain a spontaneous superlattice structure with a proportion exceeding about 20%. By forming the electron supplying layer 24 as such, one can avoid the problem of decreased electron density in the two-dimensional electron gas 23a caused by a reduced bend of the conduction band in the layer 24 at the heteroepitaxial interface between the layer 24 and the layer 23.

Figure 7:
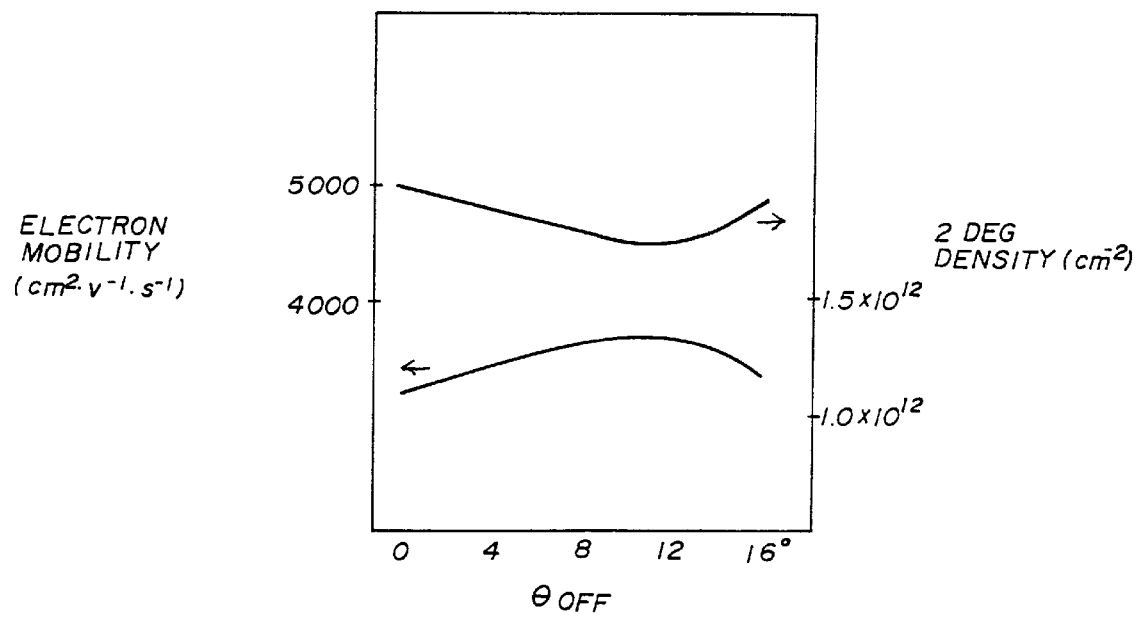
FIG. 7 is a diagram showing the electron mobility and electron density of a two-dimensional electron gas formed in the structure of FIG. 6.

FIG. 7 shows the electron mobility in the two-dimensional electron gas and the density of the two-dimensional electron gas as a function of the off-angle $\theta_{OFF}$.

Referring to FIG. 7, it will be noted that the electron mobility decreases slightly with increasing off-angle $\theta_{OFF}$ and takes a minimum at the $\theta_{OFF}$ of about 12°, while the magnitude of change of the electron mobility is insignificant. On the other hand, the density of the two-dimensional electron gas increases with increasing off-angle $\theta_{OFF}$ and reaches a maximum at the $\theta_{OFF}$ of about 12°.

TABLE II below shows the relationship between the step width and the electron mobility for the HEMT of FIG. 6.

TABLE II

| InGaAs step interval | electron mobility at $n_s = 1 \times 10^{12}$ cm⁻² | electron mobility at $n_s = 1.5 \times 10^{12}$ cm⁻² |
|---|---|---|
| 80 nm | 3500 | 3820 |
| 150 nm | 3700 | 3750 |
| 400 nm | 4200 | 3850 |

$n_s$ carrier density in 2-DEG

The result of TABLE II indicates that the electron mobility in the two-dimensional electron gas 23a increases with increasing step width $W_2$, while this tendency appears particularly conspicuous when the carrier density $n_s$ of the two-dimensional electron gas is small.

TABLE III below shows the transconductance and the K-factor of the HEMT thus obtained, with the gate length of 0.15 μm and the gate width of 20 μm. It will be noted that both the transconductance $g_m$ and the K-factor are improved with the increase of the step width.

TABLE III

| step width | $g_m$ (mS/mm) | K(mA/V²/mm) |
|---|---|---|
| 80 nm | 608 | 760 |
| 150 nm | 620 | 800 |
| 400 nm | 630 | 1000 |

Figure 8:
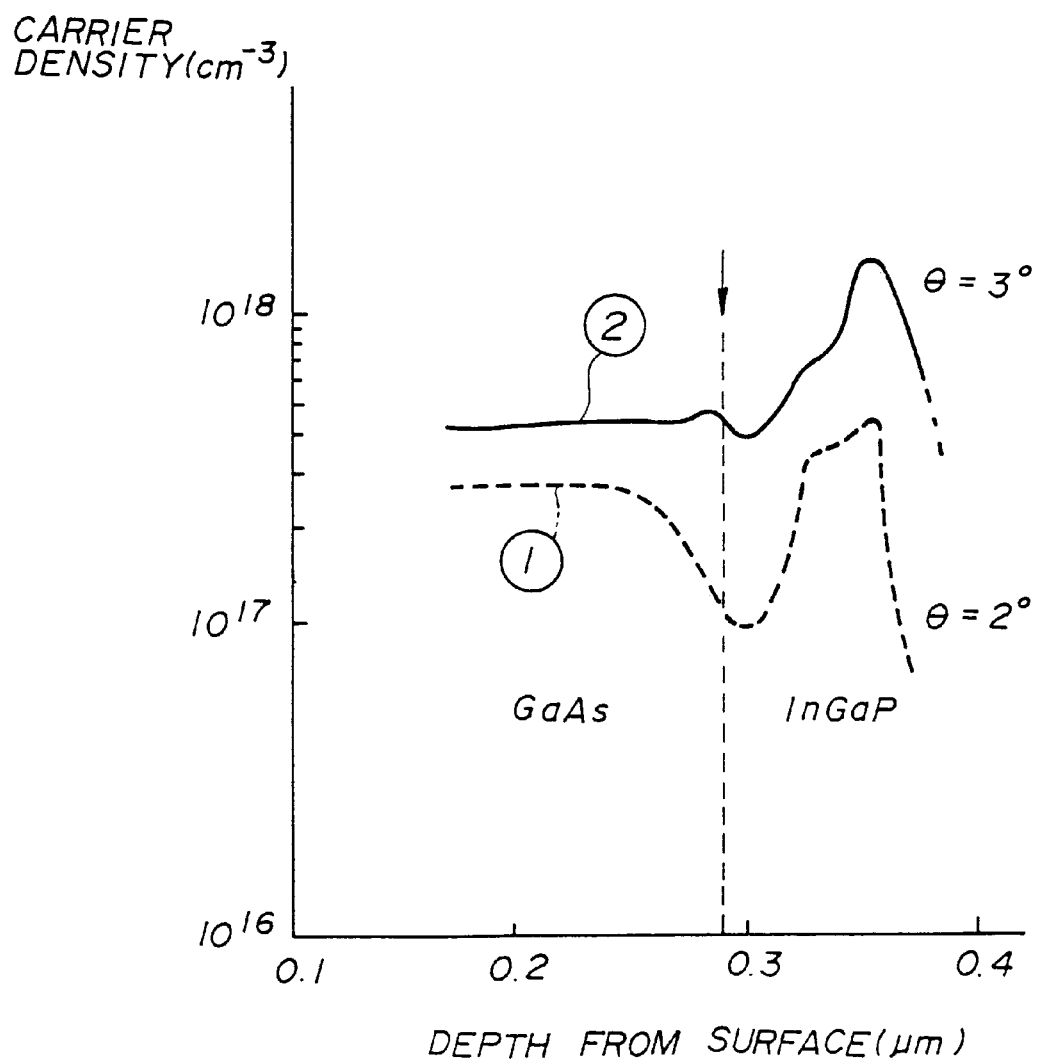
FIG. 8 is a diagram showing the elimination of carrier depletion in the structure of FIG. 6.

FIG. 8 shows the carrier density profile in the structure of FIG. 6 along a line 1–1' which crosses the heterojunction interface between the InGaP electron supplying layer 24 and the GaAs cap layer 25.

Figure 1:
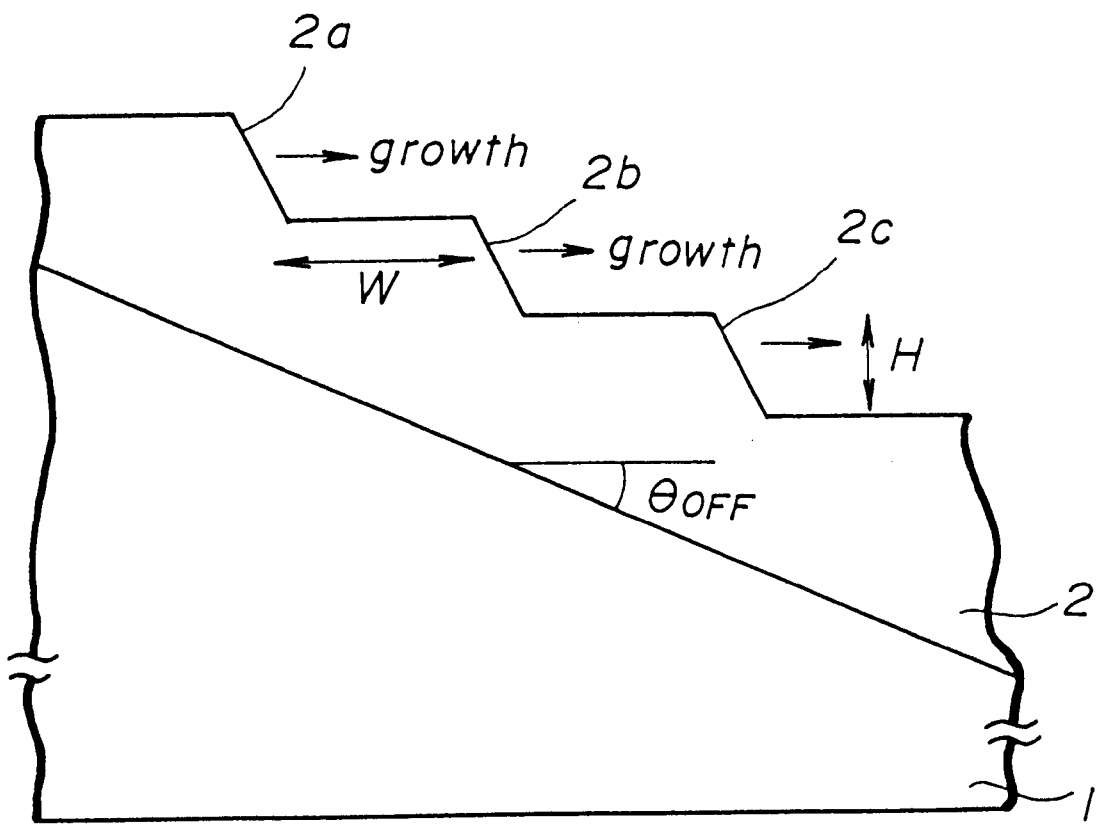
FIG. 1 is a diagram showing a multi-step structure formed on an inclined crystal surface of a substrate.
Figure 2:
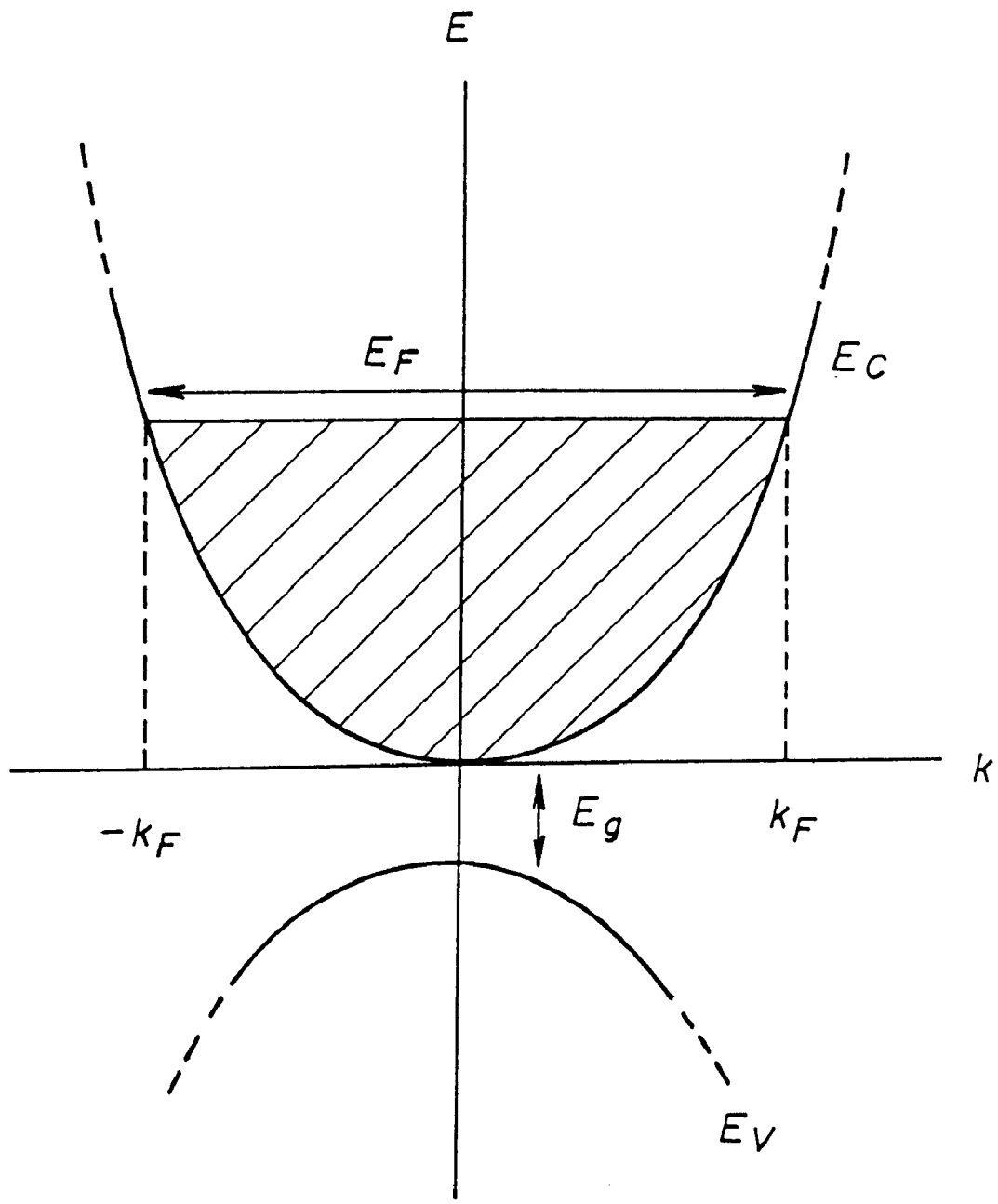
FIG. 2 is a band diagram explaining the problem associated with the formation of the multi-step structure of FIG. 1.
Figure 3:
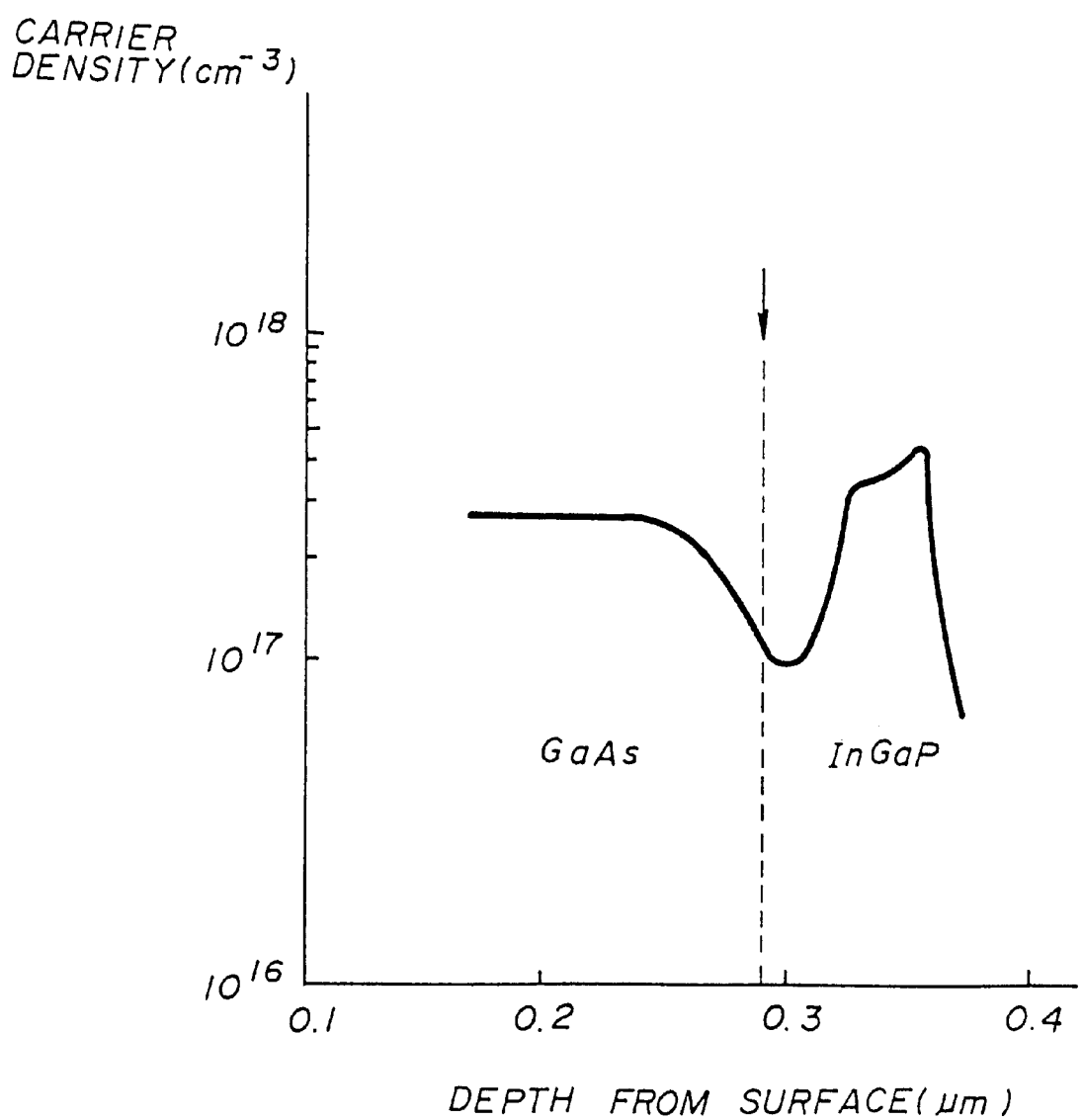
FIG. 3 is a diagram showing the problem of depletion of carriers occurring in a conventional heteroepitaxial structure.

Referring to FIG. 1, the curve represented by a broken line and designated as "1" corresponds to the conventional carrier profile shown in FIG. 3, while the curve represented by the continuous line and designated as "2" represents the carrier profile realized in the structure of FIG. 6 for the case in which the off-angle $\theta_{OFF}$ is set to 3°. It will be noted that, by setting the off-angle $\theta_{OFF}$ of the substrate 21 to 3°, one can successfully eliminate the problem of the carrier depletion at the interface between the electron supplying layer 24 and the cap layer 25. A similar disappearance of the carrier depletion is confirmed also for the off-angle $\theta_{OFF}$ larger than 3° in view of the result of Table I explained before. In other words, the source-drain resistance of the HEMT is substantially reduced by setting the off-angle $\theta_{OFF}$ of the substrate 21 to 3° or more.

Figure 9:
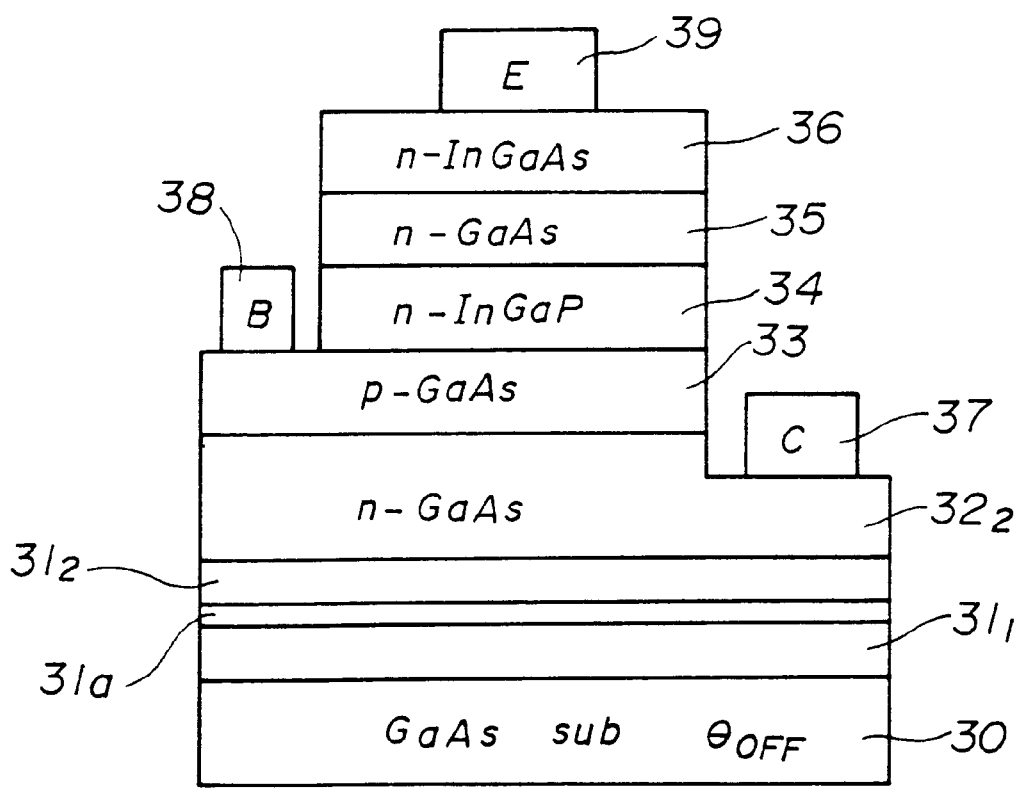
FIG. 9 is a diagram showing the construction of an HBT according to a second embodiment of the present invention.

FIG. 9 shows the construction of an HBT according to a second embodiment of the present invention.

Referring to FIG. 9, the HBT is constructed on a semi-insulating substrate 30 of GaAs having an inclined upper major surface characterized by an offset angle $\theta_{OFF}$, wherein a buffer layer 31 of undoped GaAs is provided on the substrate 30 with a thickness of about 500 nm by an MOVPE process. The buffer layer 31 includes a layer 31a of InGaP having a thickness of less than 100 nm, and the layer 31a divides the buffer layer 31 into a lower layer $31_1$ and an upper layer $31_2$. By providing the InGaP layer 31a as such, one can increase the step width of the multi-step structure formed on the upper major surface of the upper buffer layer $31_2$ beyond about 300 nm.

Alternatively, the buffer layer $31_2$ may be formed by supplying arsine and TMG with respective flowrates such that the ratio of the flowrate of arsine to the flowrate of TMG exceeds about 1 but smaller than about 5. Thereby, the foregoing growth rate exceeding about 0.6 nm/sec is achieved, and the step width on the upper major surface of the buffer layer $31_2$ exceeds 300 nm.

Further, a collector layer 32 of n-type GaAs is grown on the buffer layer 31 epitaxially by an MOVPE process with a thickness of about 500 nm, and a p-type base layer 33 of GaAs is grown epitaxially with a thickness of about 70 nm by an MOVPE process. Further, an emitter layer 34 of n-type InGaP is grown further on the base layer 33 with a thickness of 25 nm by an MOVPE process.

On the emitter layer 34, a first cap layer 35 of n-type GaAs is grown also by an MOVPE process with a thickness of 33 nm and a second cap layer 36 of n-type InGaAs is grown by an MOVPE process with a thickness of 11 nm. Further, a collector electrode 37 is provided on an exposed upper major surface of the upper collector layer $32_2$ to form an ohmic contact therewith. Similarly, a base electrode 38 and an emitter electrode 39 are provided on respective exposed upper major surfaces of the layers 33 and 36.

In the HBT structure of FIG. 9, one can eliminate the problem of depletion of carriers at the heteroepitaxial interface between the InGaP emitter layer 34 and the GaAs cap layer 35, by setting the off-angle $\theta_{OFF}$ to be equal to or larger than 2°, similarly to the HEMT of FIG. 6.

Further, the present invention is not limited to the embodiments described heretofore, but various variations and modifications may be made without departing from the scope of the invention.

What is claimed is:

1. A heterobipolar transistor, comprising:
    a substrate of semi-insulating GaAs having an inclined upper major surface;
    a collector layer of GaAs having a first conductivity type, provided on said substrate;
    a base layer of GaAs having a second, opposite conductivity type, provided on said collector layer;
    an emitter layer of said first conductivity type, provided on said substrate;
    a cap layer of InGaAs having said first conductivity type, provided on said emitter layer;
    collector electrode provided on said collector layer;
    a base electrode provided on said base layer; and
    an emitter electrode provided on said cap layer;
    said emitter layer having a multi-step structure on an upper major surface thereof,
    wherein said multi-step structure includes a number of steps each having a step height of five or more atomic layers and a step width of 300 nm or more.

2. A heterobipolar transistor as claimed in claim 1, wherein said upper major surface of said substrate is inclined by an angle of 2° or more from a (100)-oriented surface.

3. A heterobipolar transistor as claimed in claim 2, wherein said upper major surface of said substrate is inclined in a (111)A direction.

4. A heterobipolar transistor as claimed in claim 1, wherein said emitter layer has a composition set such that a lattice misfit with respect to said cap layer does not exceed $1\times10^{-3}$.

5. A heterobipolar transistor as claimed in claim 1, wherein said emitter layer contains a spontaneous superlattice structure with a proportion not exceeding 20%.

6. A heterobipolar transistor as claimed in claim 1, further including a buffer layer of undoped GaAs between said substrate and said collector layer, wherein said buffer layer includes a layer of InGaP having a thickness of less than 100 nm within a distance of 500 nm from the upper major surface of said substrate.

7. A quantum well structure, comprising:
    a substrate of GaAs;
    a first barrier layer of InGaP provided on said substrate;
    a quantum well layer of GaAs provided on said first barrier layer with a thickness of about ten molecular layers; and
    a second barrier layer of InGaP provided on said quantum well layer,
    said quantum well structure having a multi-step structure with a step width of 300 nm or more,
    wherein said quantum well structure provided a photo emission at 77 K with a wavelength shorter than about 750 nm.

* * * * *